(12) United States Patent
Nam et al.

(10) Patent No.: US 10,319,726 B2
(45) Date of Patent: Jun. 11, 2019

(54) SEMICONDUCTOR DEVICE (71) Applicant: Samsung Electronics Co., Ltd., Suwon-si (KR)

(72) Inventors: In Cheol Nam, Seoul (KR); Sung Hee Han, Hwaseong-si (KR); Dae Sun Kim, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 2 days.

(21) Appl. No.: 15/642,394

(22) Filed: Jul. 6, 2017

(65) Prior Publication Data
US 2018/0130806 A1 May 10, 2018

(30) Foreign Application Priority Data

Nov. 4, 2016 (KR) ........................ 10-2016-0146773

(51) Int. Cl.
| H01L 29/06 | (2006.01) |
| H01L 29/49 | (2006.01) |
| H01L 29/78 | (2006.01) |
| H01L 21/765 | (2006.01) |
| H01L 27/108 | (2006.01) |

(52) U.S. Cl.
CPC ...... *H01L 27/10826* (2013.01); *H01L 21/765* (2013.01); *H01L 27/10823* (2013.01); *H01L 27/10876* (2013.01); *H01L 27/10879* (2013.01); *H01L 27/10897* (2013.01); *H01L 29/0646* (2013.01); *H01L 29/4925* (2013.01); *H01L 29/785* (2013.01)

(58) Field of Classification Search
CPC ................................................ H01L 27/10826
See application file for complete search history.

(56) References Cited

U.S. PATENT DOCUMENTS

| 6,245,605 | B1 | 6/2001 | Hwang et al. | |
| 9,111,991 | B2 | 8/2015 | Lee et al. | |
| 9,178,039 | B2 | 11/2015 | Park et al. | |
| 9,275,999 | B2 | 3/2016 | Chang et al. | |
| 9,281,369 | B2 | 3/2016 | Yang | |
| 9,853,031 | B1* | 12/2017 | Cho | H01L 27/10823 |
| 2007/0190728 | A1* | 8/2007 | Sreekantham | H01L 29/4925 438/270 |
| 2010/0240184 | A1* | 9/2010 | Jung | H01L 21/28052 438/270 |
| 2011/0284966 | A1* | 11/2011 | Wen | H01L 21/823456 257/368 |
| 2013/0011981 | A1 | 1/2013 | Zhu et al. | |
| 2013/0026578 | A1* | 1/2013 | Tsau | H01L 21/823842 257/368 |
| 2013/0171801 | A1* | 7/2013 | Park | H01L 21/0214 438/400 |

(Continued)

*Primary Examiner* — Matthew E Warren
(74) *Attorney, Agent, or Firm* — Muir Patent Law, PLLC (57) ABSTRACT

A semiconductor device includes a substrate including an active region and an element isolation region defining the active region, a gate trench extending into the element isolation region and penetrating the active region, and a gate structure filling the gate trench and including a first conductivity-type semiconductor layer, a conductive layer, and a second conductivity-type semiconductor layer, sequentially stacked from a lower portion of the gate trench.

19 Claims, 7 Drawing Sheets

(56) References Cited

U.S. PATENT DOCUMENTS

| | | | |
|---|---|---|---|
| 2013/0178056 A1 | 7/2013 | Zhu et al. | |
| 2014/0063934 A1* | 3/2014 | Oh | H01L 29/945 |
| | | | 365/182 |
| 2014/0291755 A1* | 10/2014 | Baek | H01L 29/4236 |
| | | | 257/330 |
| 2015/0187899 A1 | 7/2015 | Jeong | |
| 2015/0340453 A1* | 11/2015 | Cho | H01L 29/423 |
| | | | 257/330 |
| 2015/0349073 A1* | 12/2015 | Kang | H01L 29/4236 |
| | | | 257/330 |
| 2016/0056160 A1 | 2/2016 | Jang et al. | |
| 2016/0181377 A1 | 6/2016 | Oh | |
| 2016/0204215 A1* | 7/2016 | Chang | H01L 21/845 |
| | | | 257/401 |
| 2017/0186844 A1* | 6/2017 | Kim | H01L 27/10823 |
| 2018/0151670 A1* | 5/2018 | Wu | H01L 21/2256 |
| 2018/0174845 A1* | 6/2018 | Jang | H01L 21/28088 |

* cited by examiner

SEMICONDUCTOR DEVICE

CROSS-REFERENCE TO RELATED APPLICATION

This application claims priority under 35 U.S.C § 119 to Korean Patent Application No. 10-2016-0146773 filed on Nov. 4, 2016 in the Korean Intellectual Property Office, the disclosure of which is incorporated herein by reference in its entirety.

BACKGROUND

1. Field

The present disclosure relates to a semiconductor device.

2. Description of Related Art

As the integration of semiconductor devices has rapidly increased, the size of transistors has been sharply decreased. Thus, research has been conducted in the field of three-dimensional transistors having a recessed gate structure, an embedded gate structure, or the like.

SUMMARY

An aspect of the present disclosure may provide a semiconductor device in which leakage current is reduced while having improved reliability.

According to an aspect of the present disclosure, a semiconductor device includes a substrate including an active region and an element isolation region defining the active region, a gate trench extending into the element isolation region and penetrating the active region, and a gate structure filling the gate trench and including a first conductivity-type semiconductor layer, a conductive layer, and a second conductivity-type semiconductor layer, sequentially stacked from a lower portion of the gate trench.

According to an aspect of the present disclosure, a semiconductor device includes a substrate including an active region and an element isolation region defining the active region, a main gate embedded in the active region, and a field pass gate embedded in the element isolation region. Each of the main gate and the field pass gate includes a first conductivity-type semiconductor layer, a metal layer, and a second conductivity-type semiconductor layer, sequentially stacked from corresponding lower portions of the main gate and the field pass gate.

According to an aspect of the present disclosure, a semiconductor device includes a substrate including an active region and an element isolation region adjacent to the active region; a first gate trench embedded in the active region; a second gate trench embedded in the element isolation region, wherein each of the first gate trench and the second gate trench includes a gate structure having a multilayer structure in which conductive materials having different work functions are sequentially stacked from corresponding lower portions of the first gate trench and the second gate trench.

BRIEF DESCRIPTION OF DRAWINGS

The above and other aspects, features and other advantages of the present disclosure will be more clearly understood from the following detailed description, taken in conjunction with the accompanying drawings.

DETAILED DESCRIPTION

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also, these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Figure 1:
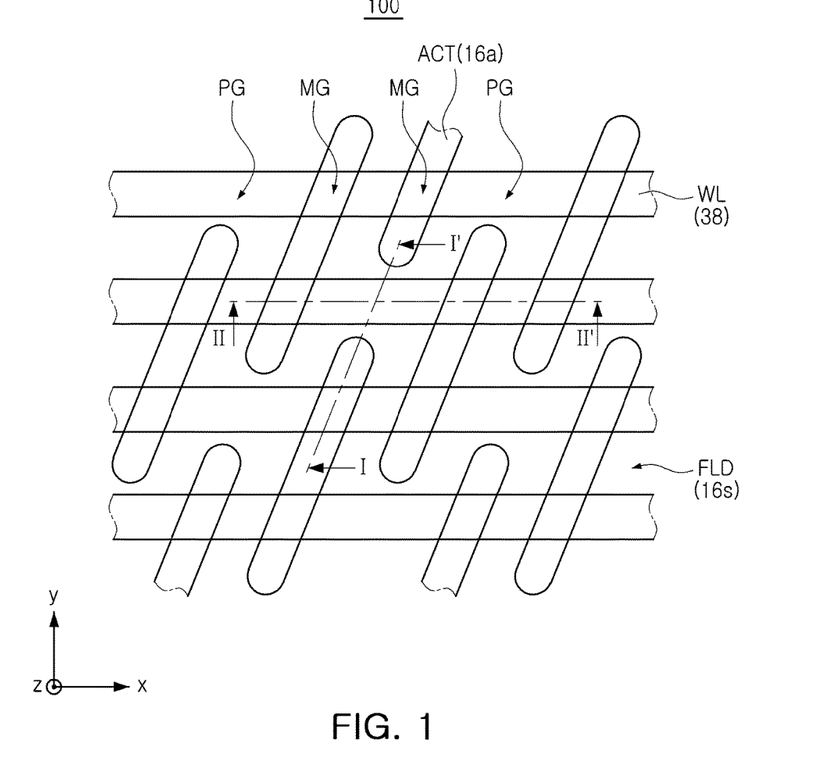
FIG. 1 is a layout diagram of a semiconductor device according to an example embodiment of the present disclosure.
Figure 2A:
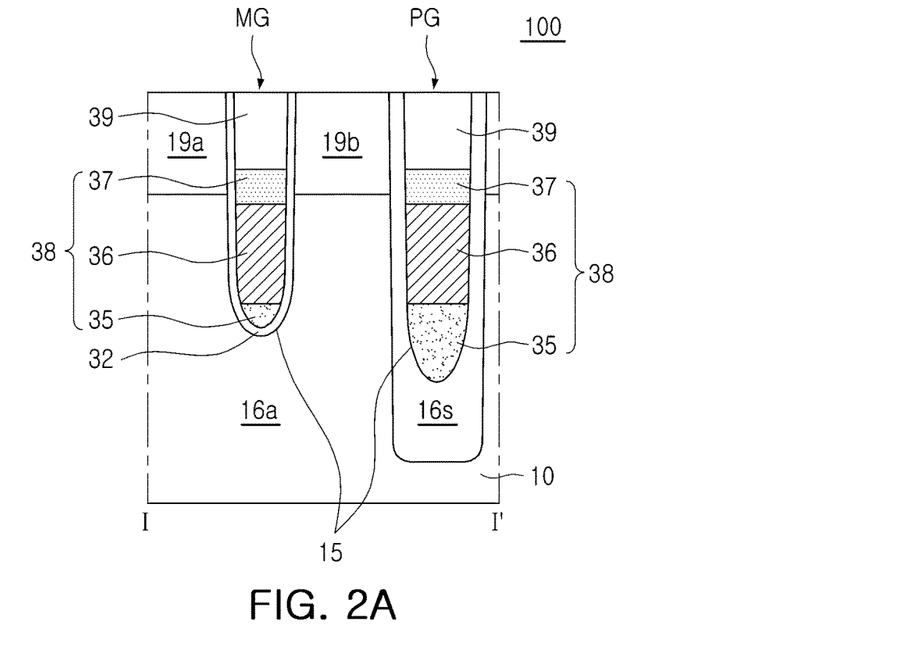
FIGS. 2A and 2B are cross-sectional views illustrating a semiconductor device according to an example embodiment of the present disclosure.
Figure 2B:
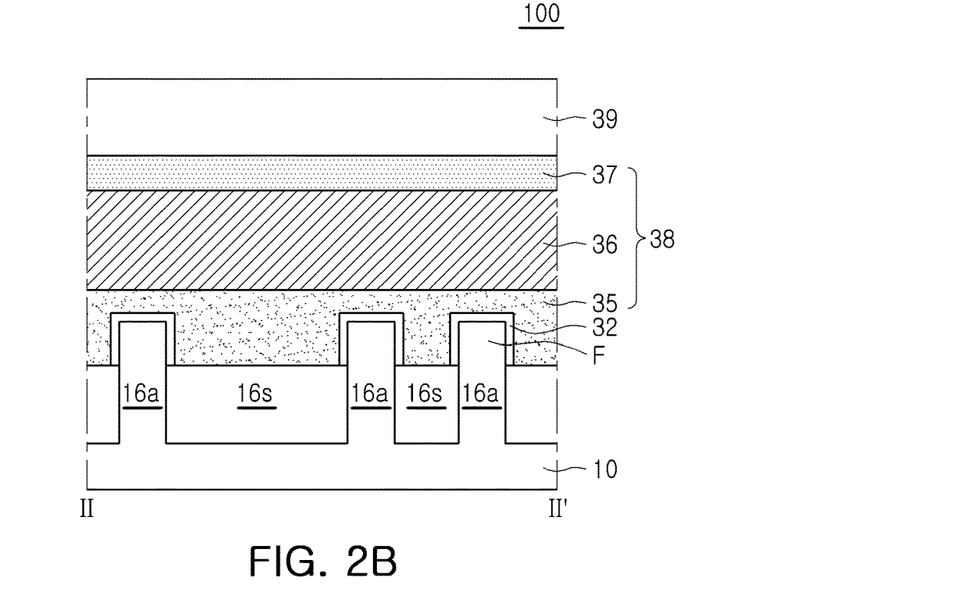

FIG. 1 is a layout diagram illustrating a portion of constituent elements of a semiconductor device 100 according to an example embodiment. FIGS. 2A and 2B are cross-sectional views illustrating a semiconductor device 100 according to an example embodiment. FIG. 2A is a cross-sectional view taken along line I-I' of FIG. 1, and FIG. 2B is a cross-sectional view taken along line II-II' of FIG. 1.

As used herein, a semiconductor device 100 may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1, the semiconductor device 100 may include active regions ACT, an element isolation region FLD defining the active regions ACT, and word lines WL intersecting the active regions ACT. The active regions ACT may be arranged to have predetermined intervals therebetween in a first direction, for example, an x-axis direction and in a second direction, for example, a y-axis direction, and may extend in a direction forming an acute angle with the first direction. Each active region ACT may intersect two word lines WL. Each active region ACT may include three source/drain regions disposed on both sides of two word lines WL. The word lines WL may intersect a plurality of active regions ACT and the element isolation region FLD while extending in the first direction. Portions of the word lines WL disposed in the active regions ACT may be referred to as main gates MG, and portions of the word lines WL disposed in the element isolation region FLD adjacent to the active regions ACT may be referred to as field-pass gates PG. The active regions ACT may be cell active regions inside a memory cell array region of a memory device, such as a dynamic random access memory (DRAM), or the like.

The semiconductor device 100 may further include bit lines extending in the second direction, for example, the y-axis direction and intersecting the word lines WL, and the bit lines may be connected to one of the source/drain regions of the active regions ACT. The semiconductor device 100 may further include information storage elements electrically connected to the remainder of the source/drain regions of the active regions ACT. In some embodiments, the information storage elements may be DRAM cell capacitors storing data in a memory cell array such as a DRAM.

With reference to FIGS. 2A and 2B, the semiconductor device 100 may include an active region 16a, an element isolation region 16s defining the active region 16a, a main gate MG embedded in the active region 16a, a field pass gate PG embedded in the element isolation region 16s, a gate insulating layer 32 between the main gate MG and the active region 16a, and source/drain regions 19a and 19b disposed in upper portions of the active region 16a on both sides of the main gate MG.

A semiconductor substrate 10 may be, for example, a monocrystalline silicon substrate. The semiconductor substrate 10 may include, for example, a group IV compound semiconductor, a group III-V compound semiconductor, or a group II-VI compound semiconductor. An example of the semiconductor substrate 10 may include a silicon-on-insulator (SOI) substrate.

The element isolation region 16s defining the active region 16a may be disposed in the semiconductor substrate 10. The element isolation region 16s may be a shallow trench isolation region. The active region 16a may include a first conductivity-type impurity. In the example embodiment, the first conductivity-type impurity may be a P-type impurity, for example, boron (B) or $BF_3$. The element isolation region 16s may include an insulating material, such as a material of a silicon oxide film, a silicon nitride film, a silicon oxynitride film, a combination thereof.

A gate trench 15 may be formed in the semiconductor substrate 10. The gate trench 15 may extend into the element isolation region 16s while passing through (e.g., penetrating) the active region 16a. The gate trench 15 may include a first portion located (e.g., embedded) in the active region 16a and a second portion located (e.g., embedded) in the element isolation region 16s, and a bottom of the first portion may be positioned to be higher than a level of a bottom of the second portion. For example, a bottom most surface/portion of the first portion of the gate trench 15 located in the active region 16a may be positioned at a level in a direction perpendicular to the substrate 10 higher than a level of a bottom most surface/portion of the second portion located in the element isolation region 16s in the direction perpendicular to the substrate 10. In this exemplary embodiment, since the gate trenches 15 include the first portion and the second portion having different depths, pin structures F in which the active region 16a protrudes upwardly (e.g., in a direction perpendicular to the substrate 10) of the element isolation region 16s may be formed in the gate trench 15. The first portion of the gate trench 15 embedded in the active region 16a may also be referred to as a first gate trench and the second portion of the gate trench 15 embedded in the element isolation region 16s may also be referred to as a second gate trench.

A first source/drain region 19a and a second source/drain region 19b may be disposed on an upper portion of the active region 16a on both sides of the gate trench 15. The first source/drain region 19a and the second source/drain region 19b may be spaced apart from each other by the gate trench 15.

A bit line (not shown) physically and electrically connected to the first source/drain region 19a may be provided. The bit line may include polycrystalline silicon, a metal, a metal silicide, a metal nitride, or a combination thereof. A capping pattern may be disposed on the bit line. The capping pattern may be formed of an insulating material such as silicon nitride or the like. A contact plug physically and electrically connected to the second source/drain region 19b may be disposed. An information storage element may be disposed on the contact plug. The contact plug may be, for example, a conductive plug formed of a conductive material such as a metal. In some embodiments, the contact plug may include polycrystalline silicon, a metal, a metal silicide, a metal nitride, or a combination thereof. For example, when the semiconductor device 100 according to the example embodiment is a DRAM device, the information storage element may be a cell capacitor.

A gate insulating layer 32 may be disposed in the gate trench 15. The gate insulating layer 32 may include silicon oxide or silicon oxynitride. In the example embodiment, the gate insulating layer 32 may be formed by an oxidation process. For example, the gate insulating layer 32 may only be formed on the active region 16a exposed by the gate trench 15. Examples of the oxidation process may include a thermal oxidation process, a radical oxidation process, a plasma oxidation process, and the like. In an example, the gate insulating layer 32 may be formed by a deposition process. For example, the gate insulating layer 32 may be formed on a surface of the active region 16a exposed by the gate trench 15 and on a surface of the element isolation region 16s. Examples of the deposition process may include a chemical vapor deposition (CVD) process, an atomic layer deposition (ALD) process, and the like.

A gate structure 38 may be disposed within the gate trench 15. The gate structure 38 may correspond to the word line WL of FIG. 1. The gate structure 38 may have an embedded gate structure embedded in the active region 16a and the element isolation region 16s. The gate structure 38 may partially fill the gate trench 15. An upper surface of the gate structure 38 may be disposed to be lower than an upper surface of the active region 16a. For example, an upper most surface/portion of the gate structure 38 may be positioned at a level in a direction perpendicular to the substrate 10 lower than a level of an upper most surface/portion of the active region 16a in the direction perpendicular to the substrate 10.

A capping layer 39 may be disposed on the gate structure 38 to fill the entirety of the gate trench 15. An upper surface of the capping layer 39 may be formed to have the same level as an upper surface level of the active region 16a. For example, an upper most surface/portion of the capping layer 39 may be positioned at the same level in a direction perpendicular to the substrate 10 as a level of an upper most surface/portion of the active region 16a in the direction perpendicular to the substrate 10.

The gate structure 38 may have a multilayer structure in which conductive materials having different work functions are stacked. The gate structure 38 may include a first conductivity-type semiconductor layer 35, an uppermost second conductivity-type semiconductor layer 37, and a conductive layer between the first conductivity-type semiconductor layer 35 and the second conductivity-type semiconductor layer 37, For example, the gate structure 38 may include a first conductivity-type semiconductor layer 35, a conductive layer 36, and a second conductivity-type semiconductor layer 37 sequentially stacked from a lower portion. For example, the first conductivity-type semiconductor layer 35 may be provided on lower portion of the gate trench 15, the conductive layer 36 may be provided on an upper surface of the first conductivity-type semiconductor layer 35, and the second conductivity-type semiconductor layer 37 may be provided on an upper surface of conductive layer 36.

The first conductivity-type semiconductor layer 35 may include polycrystalline silicon doped with a p-type impurity, and the second conductivity-type semiconductor layer 37 may include polycrystalline silicon doped with an n-type impurity, but the disclosure is not limited thereto. The conductive layer 36 may include a metal having a work function value lower than that of the first conductivity-type semiconductor layer 35 and having a work function value higher than that of the second conductivity-type semiconductor layer 37. For example, the conductive layer 36 may include tungsten and the work function value of the conductive layer 36 may be 4.5 eV, the work function value of first conductivity-type semiconductor layer 35 may be 5.1 eV, and the work function value of the second conductivity-type semiconductor layer 37 may be 4 eV. The conductive layer 36 may further include a conductive metal nitride conformally disposed on an upper surface of the first conductivity-type semiconductor layer 35 and a portion of the gate insulating layer 32 to surround a lower portion and a side of the metal. An example of the conductive metal nitride may include TiN, TaN, or WN.

The second conductivity-type semiconductor layer 37 may have a region overlapping the source/drain regions 19a and 19b, and the conductive layer 36 may not overlap the source/drain regions 19a and 19b. For example, the uppermost surface of the conductive layer 36 is at a level lower than the lowermost regions of the source/drain regions 19a and 19b in an upward direction perpendicular to the substrate 10. Further, the first conductivity-type semiconductor layer 35 may not overlap the source/drain regions 19a and 19b. For example, the uppermost surface of the first conductivity-type semiconductor layer 35 is at a level lower than the lowermost regions of the source/drain regions 19a and 19b in an upward direction perpendicular to the substrate 10.

In one example embodiment, as the second conductivity-type semiconductor layer 37 overlapping the source/drain regions 19a and 19b is formed of polycrystalline silicon doped with an n-type impurity, having a relatively low work function as compared with that of the conductive layer 36, gate induced drain leakage (GIDL) formed by the main gate MG and GIDL by the field pass gate PG may be reduced in a standby state or a precharge state. For example, when the semiconductor device 100 is a dynamic random access memory (DRAM), data retention characteristics of a memory cell may be improved as GIDL decreases.

The first conductivity-type semiconductor layer 35 of the main gate MG may have a first thickness in a direction perpendicular to an upper surface of the substrate fully depleted by a gate voltage in the standby mode or the precharge mode, for example, a negative (−) voltage of several hundreds of mV. The first conductivity-type semiconductor layer 35 of the field pass gate PG may have a second thickness in the direction perpendicular to the upper surface of the substrate greater than the first thickness. The upper surface of the first conductivity-type semiconductor layer 35 of the main gate MG may be located to be substantially identical to a level of upper surface of the first conductivity-type semiconductor layer 35 of the field pass gate PG. Thus, the second thickness of the first conductivity-type semiconductor layer 35 of the field-pass gate PG may be greater than a height of each of the fin structures F. The height of the fin structures F may refer to a distance from an upper surface of the element isolation region 16s to a respective upper surface of the fin structures F.

As the first conductivity-type semiconductor layer 35 is fully depleted in the main gate MG, an intensity of an effective electric field between the main gate MG and the active region 16a below the main gate MG may be reduced in the standby mode or the precharge mode, thereby reducing a depletion region below the main gate MG. Thus, gate induced junction leakage (GIJL) formed by the main gate MG may be reduced. For example, when the semiconductor device 100 is a DRAM, data retention characteristics of a memory cell may be improved as GIJL decreases.

As a design rule of a DRAM device decreases, a problem related to the new retention characteristics may occur. For example, when only one word line WL is intensively used, a phenomenon in which electrons stored in a cell capacitor adjacent to the field-pass gate PG are lost, a so-called row hammer or single row disturb, may occur.

Thus, according to the exemplary embodiments, the first conductivity-type semiconductor layer 35 formed of polycrystalline silicon doped with a p-type impurity may be disposed below the field pass gate PG resulting in an increase in an effective threshold voltage in the vicinity of the fin structures F. Thus, for example, when the semiconductor device 100 is a DRAM, the row hammer phenomenon may be prevented.

Figure 3A:
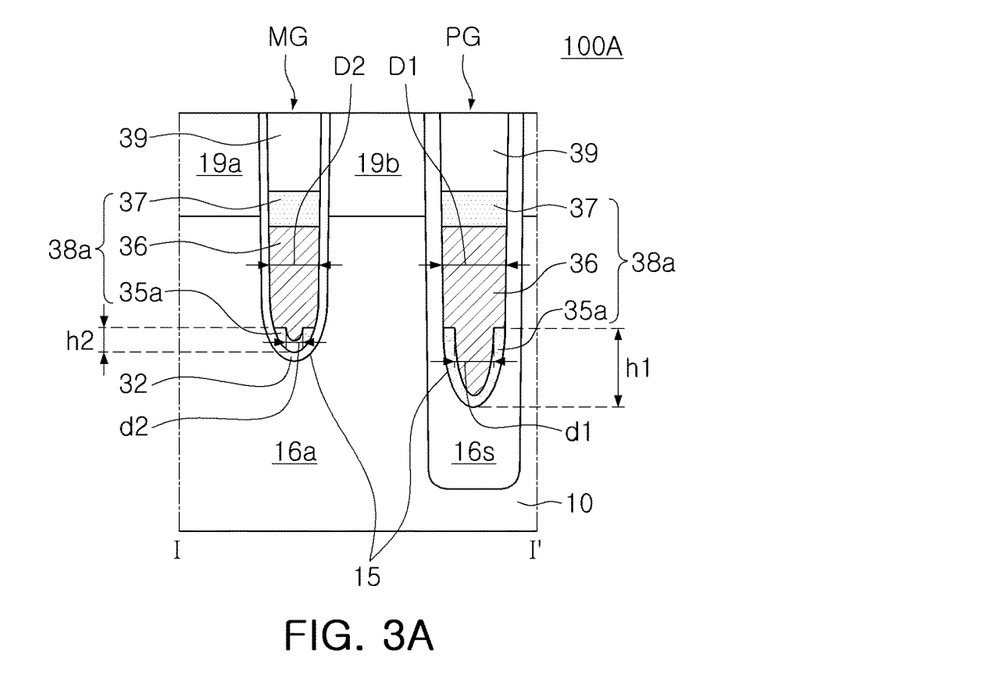
FIGS. 3A and 3B are cross-sectional views illustrating a semiconductor device according to an example embodiment of the present disclosure.
Figure 3B:
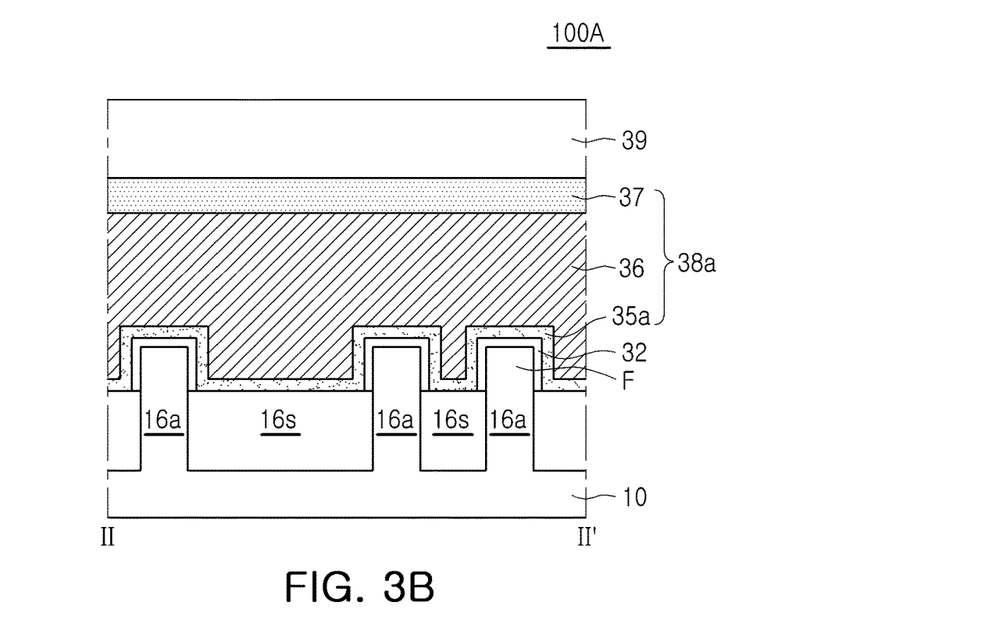

FIGS. 3A and 3B are cross-sectional views of a semiconductor device 100A according to an example embodiment. Compared to the semiconductor device 100 illustrated in FIGS. 2A and 2B, in the case of the semiconductor device 100A, a second conductivity-type semiconductor layer 37 of a gate structure 38a overlapping source/drain regions 19a and 19b may be identical to that of the semiconductor device 100, while shapes of a conductive layer 36 and a first conductivity-type semiconductor layer 35a disposed below the conductive layer 36 may be different from those of the semiconductor device 100.

Referring to FIGS. 3A and 3B, in the case of the semiconductor device 100A, the conductive layer 36 may include a first portion having a relatively narrower width which gradually decreases towards the lower portion of the gate trench 15 and a second portion disposed on the first portion and having a relatively substantially wider uniform width compared to the first portion. For example, the conductive layer 36 may include a first portion having a first width which gradually decreases towards the lower portion of each of the first gate trench (the portion of the gate trench 15 that is embedded in the active region 16a) and the second gate trench (the portion of the gate trench 15 that is embedded in the element isolation region 16s) and a second portion disposed on the first portion and having a second substantially uniform width wider than the first width in a direction parallel to an upper surface of the substrate 10. The first conductivity-type semiconductor layer 35a may be conformally formed to have a predetermined thickness along a surface of a gate insulating layer 32 and to surround the first portion of the conductive layer 36. A thickness of the first conductivity-type semiconductor layer 35a may be a thickness fully depleted by a gate voltage, for example, a negative (−) voltage of several hundreds of mV, in a standby mode or a precharge mode.

A height of the first conductivity-type semiconductor layer 35a of the main gate MG may be different from that of the first conductivity-type semiconductor layer 35a of the field pass gate PG. The height of the first conductivity-type semiconductor layer 35a may indicate a distance from a bottom of a gate trench 15 to an upper end of the first conductivity-type semiconductor layer 35a. As illustrated in FIG. 3A, a height h1 of the first conductivity-type semiconductor layer 35a of the field pass gate PG is greater than a height h2 of the first conductivity-type semiconductor layer 35a of the main gate MG. An upper end of the first conductivity-type semiconductor layer 35a of the main gate MG may be located on the same level as that of an upper end of the first conductivity-type semiconductor layer 35a of the field pass gate PG. Thicknesses of the second portions of the conductive layer 36 in a direction perpendicular to an upper surface of the substrate 10 may be the same as each other in the main gate MG and the field pass gate PG, and thicknesses of the first portions of the conductive layer 36 in the direction perpendicular to an upper surface of the substrate 10 may be different from each other in the main gate MG and the field pass gate PG. For example, as illustrated in FIG. 3A, a thickness (width) d1 of the first portion of the conductive layer 36 in the field pass gate PG (e.g., the first portion of the conductive layer 36 of the second gate trench) in a first direction parallel to an upper surface of the substrate 10 may be greater than a thickness (width) d2 of the first portion of the conductive layer 36 in the main gate MG (e.g., the first portion of the conductive layer 36 of the first gate trench) in the first direction parallel to the upper surface of the substrate 10 and a thickness (width) D1 of the second portion of the conductive layer 36 in the field pass gate PG (e.g., the second portion of the conductive layer 36 of the second gate trench) in the first direction parallel to the upper surface of the substrate 10 may be greater than a thickness (width) D2 of the second portion of the conductive layer 36 in the main gate MG (e.g., the second portion of the conductive layer 36 of the first gate trench) in the first direction parallel to the upper surface of the substrate 10.

Although not illustrated in FIGS. 3A and 3B, in an alternative embodiment, an upper end of the first conductivity-type semiconductor layer 35a of the field pass gate PG may be located at a level higher than a level of an upper end of the first conductivity-type semiconductor layer 35a of the main gate MG in a direction perpendicular to the upper surface of the substrate 10. In addition, in the alternative embodiment, a thickness of the second portion of the conductive layer 36 in the main gate MG in a first direction perpendicular to an upper surface of the substrate 10 may be greater than a thickness of the second portion of the conductive layer 36 in the field pass gate PG in the first direction perpendicular to the upper surface of the substrate 10, and the thickness of the first portion of the conductive layer 36 in the field pass gate PG may be greater than the thickness of the first portion of the conductive layer 36 in the main gate MG.

Figure 4A:
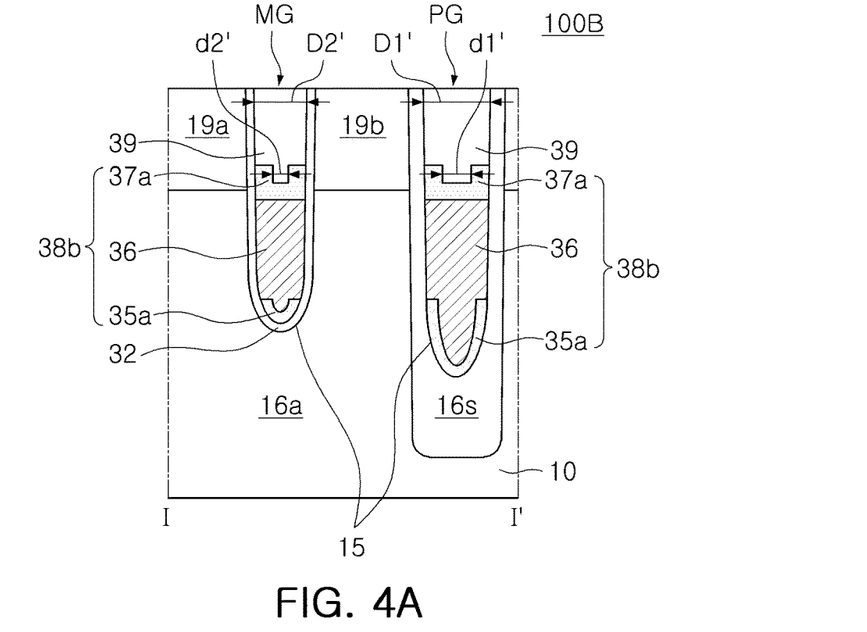
FIGS. 4A and 4B are cross-sectional views illustrating a semiconductor device according to an example embodiment of the present disclosure.
Figure 4B:
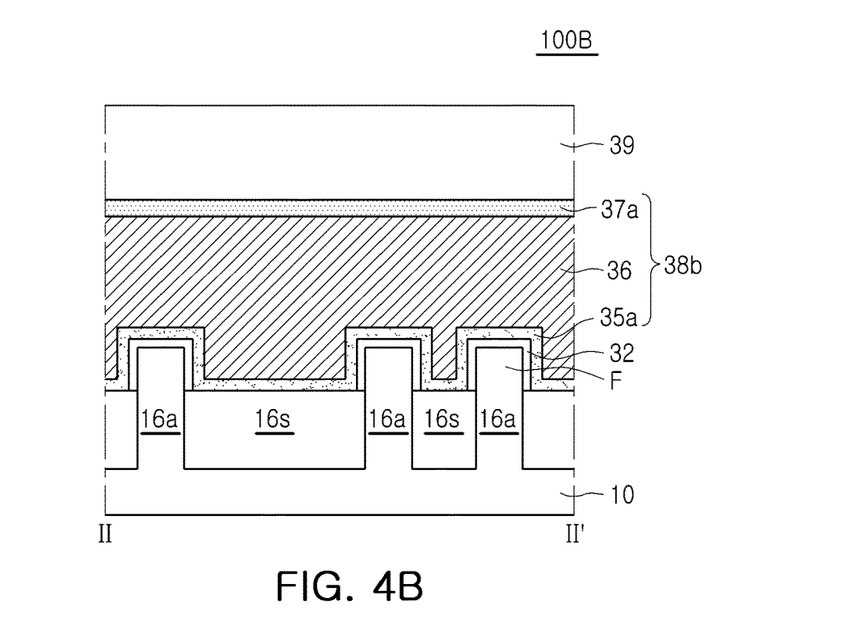

FIGS. 4A and 4B are cross-sectional views illustrating a semiconductor device 100B according to an example embodiment. Compared to the semiconductor device 100 illustrated in FIGS. 2A and 2B, in the case of the semiconductor device 100B, shapes of a conductive layer 36, a second conductivity-type semiconductor layer 37 and a first conductivity-type semiconductor layer 35a of a gate structure 38a may be different from those of the semiconductor device 100.

In the case of the semiconductor device 100B, a description of the shapes of the first conductivity-type semiconductor layer 35a and the conductive layer 36 are the same as the description of those in FIGS. 3A and 3B, and thus a description thereof will be omitted.

Referring to FIGS. 4A and 4B, in the case of the semiconductor device 100B, a capping layer 39 may include a first portion having a relatively narrower substantially uniform width and a second portion disposed on the first portion and having a relatively wider substantially uniform width compared to the first portion, in a manner similar to the case of the conductive layer 36. For example, as illustrated in FIG. 4A, a thickness d1' of the first portion of the capping layer 39 in the field pass gate PG in a first direction parallel to an upper surface of the conductive layer 36 may be greater than a thickness d2' of the first portion of the capping layer 39 in the main gate MG in the first direction parallel to the upper surface of the conductive layer 36 and a thickness D1' of the second portion of the capping layer 39 in the field pass gate PG in the first direction parallel to the upper surface of the conductive layer 36 may be greater than a thickness D2' of the second portion of the capping layer 39 in the main gate MG in the first direction parallel to the upper surface of the conductive layer 36. A second conductivity-type semiconductor layer 37a having a region overlapping source/drain regions 19a and 19b may be formed to have a predetermined thickness along an upper surface of the conductive layer 36 and a surface of a gate insulating layer 32, to surround the first portion of the capping layer 39.

Figure 5A:
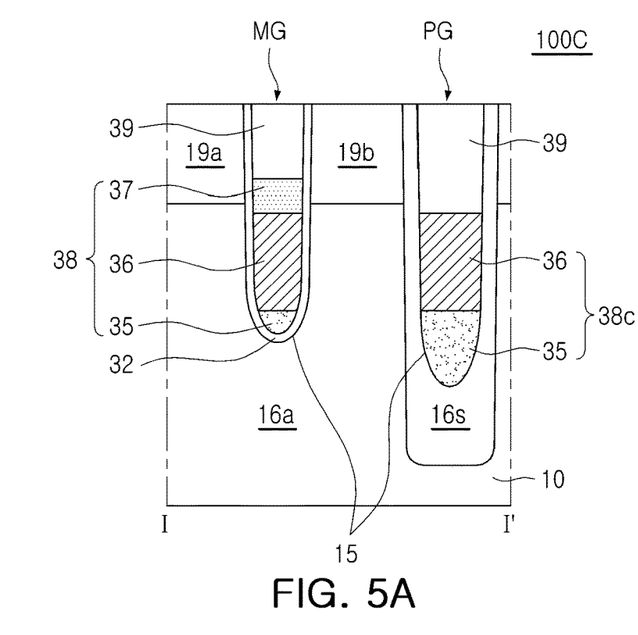
FIGS. 5A and 5B are cross-sectional views illustrating a semiconductor device according to an example embodiment of the present disclosure.
Figure 5B:
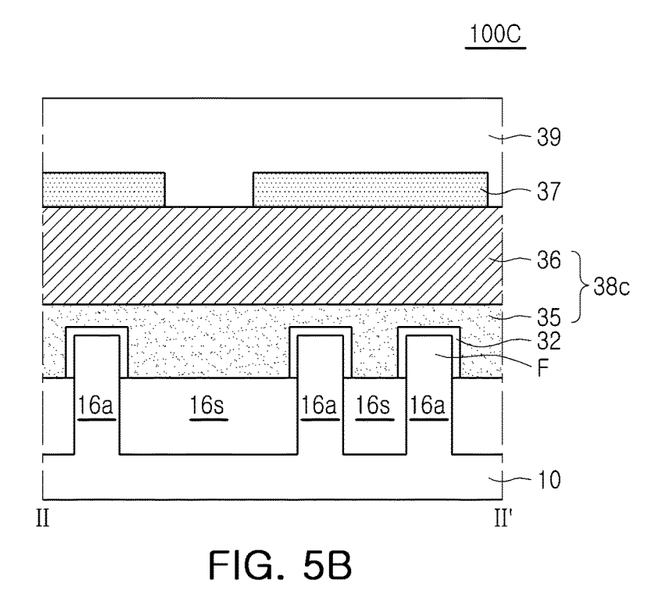

FIGS. 5A and 5B are cross-sectional views illustrating a semiconductor device 100C according to an example embodiment. Compared to the semiconductor device 100 illustrated in FIGS. 2A and 2B, in the case of the semiconductor device 100C, a stacking structure of a field-pass gate PG may be different from the structure of the semiconductor device 100 with reference to FIGS. 2A and 2B.

With reference to FIGS. 5A and 5B, in the case of the semiconductor device 100C, an upper surface level of a gate structure 38c in the field pass gate PG may be disposed to be lower than an upper surface level of a gate structure 38 in the main gate MG, and the gate structure 38c in the field pass gate PG may not overlap a second source/drain region 19b.

The main gate MG may include a first conductivity-type semiconductor layer 35, a conductive layer 36, and a second conductivity-type semiconductor layer 37, and the field pass gate PG may not include the second conductivity-type semiconductor layer 37. The field pass gate PG may include the first conductivity-type semiconductor layer 35 and the conductive layer 36.

Due to an increase in a distance between the second source/drain region 19b and the field pass gate PG, an intensity of an electric field between the second source/drain region 19b and the field pass gate PG may be reduced, and GIDL formed by the field pass gate PG may be reduced.

Figure 6:
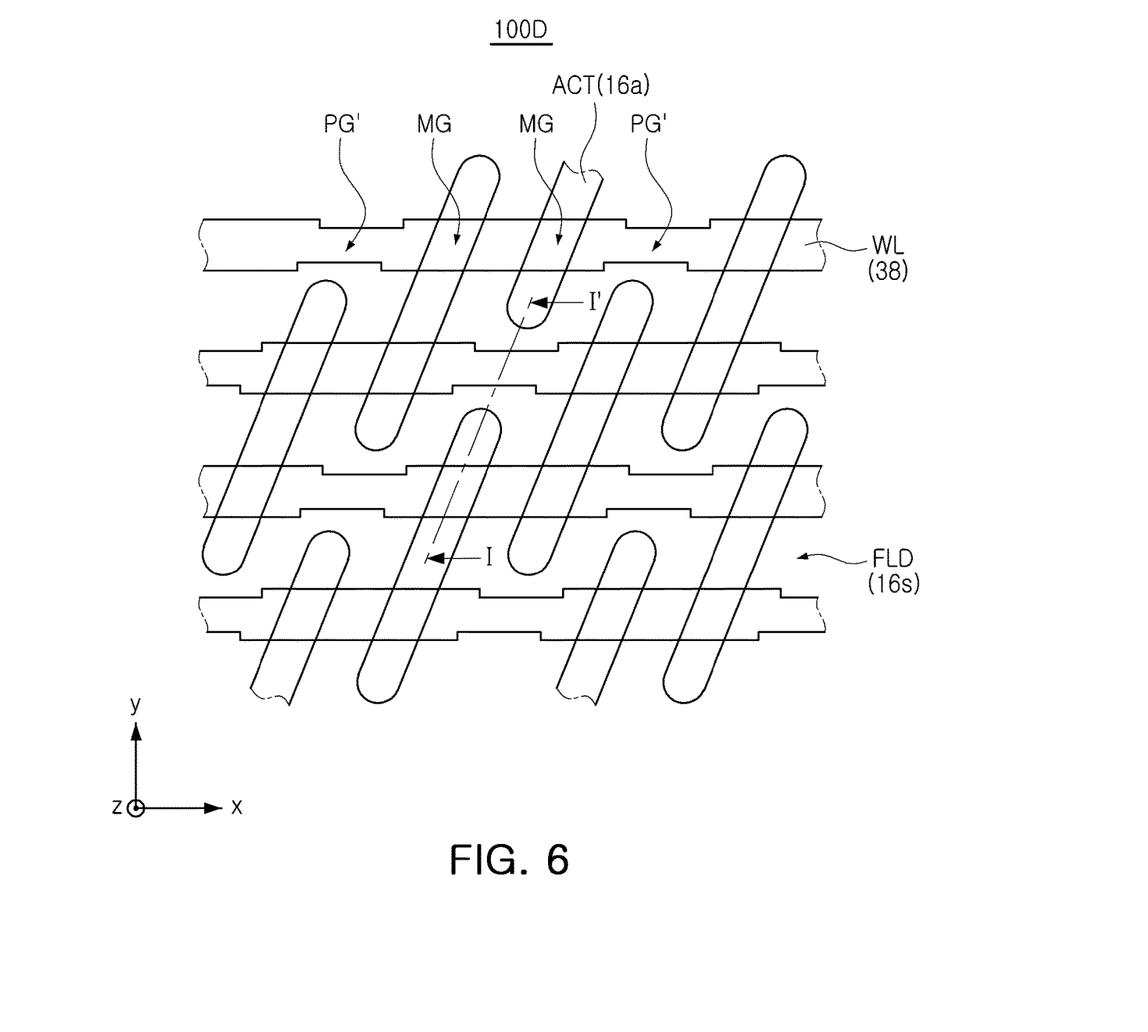
FIGS. 6 and 7 are cross-sectional views of a semiconductor device according to an example embodiment of the present disclosure.
Figure 7:
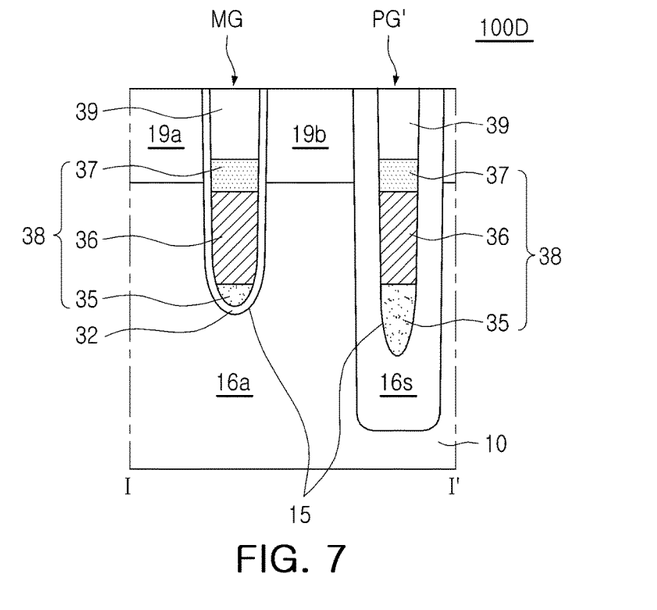

FIG. 6 is a layout diagram and FIG. 7 is a cross-sectional view illustrating a semiconductor device 100D according to an example embodiment.

Compared to the semiconductor device 100 illustrated in FIGS. 2A and 2B, in the case of the semiconductor device 100C, a stacking structure of a field-pass gate PG may be different from the structure of the semiconductor device 100 with reference to FIGS. 2A and 2B. With reference to FIGS. 6 and 7, a width of the field pass gate PG may be formed to be narrower than a width of the main gate MG. Thus, a separation distance between the field pass gate PG and the active region 16a may be formed to be wider as compared to an example embodiment in FIGS. 2A and 2B. Similarly, a width of a capping layer 39 disposed in the field pass gate PG may be formed to be narrower than a width of the capping layer 39 disposed in the main gate MG. An intensity of an electric field between the second source/drain region 19b and the field pass gate PG may be reduced, and GIDL formed by the field pass gate PG may be reduced. In addition, a row hammer formed by the field pass gate PG may be prevented.

Example embodiments described above with reference to FIGS. 1 to 7 may be combined with each other.

For example, an example embodiment of FIGS. 3A and 3B may be combined with an example embodiment of FIGS. 5A and 5B, and an example embodiment of FIGS. 4A and 4B may be combined with an example embodiment of FIGS. 5A and 5B.

An example embodiment of FIGS. 3A and 3B may be combined with an example embodiment of FIG. 7, an example embodiment of FIGS. 4A and 4B may be combined with an example embodiment of FIG. 7, and an example embodiment of FIGS. 5A and 5B may be combined with an example embodiment of FIG. 7.

Example embodiments described above with reference to FIGS. 1 to 7 are described based on the case in which a cell transistor is an n-type MOS transistor. However, the present disclosure is not limited thereto and may be applied to the case in which the cell transistor is a P-type MOS transistor.

In this case, a stacking structure of a gate structure may be changed. The gate structure may have a structure in which an N-type polycrystalline silicon layer/a conductive layer/ and a P-type polycrystalline silicon layer are stacked from a lower portion.

Figure 8:
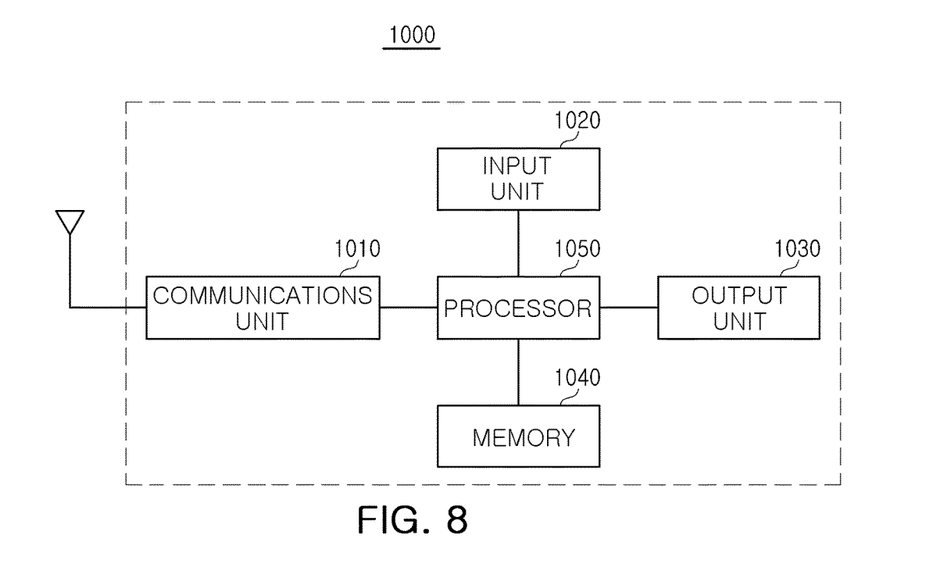
FIG. 8 is a block diagram of an electronic device including a semiconductor device according to an example embodiment of the present disclosure.

FIG. 8 is a block diagram of an electronic device including a semiconductor device according to an example embodiment of the present disclosure.

With reference to FIG. 8, an electronic device 1000 may include a communications unit 1010, an input unit 1020, an output unit 1030, a memory 1040, and a processor 1050.

The communications unit 1010 may include a wired/wireless communications module, and may include a wireless Internet module, a near-field communications module, a global positioning system (GPS) module, a mobile communications module, or the like. The wired/wireless communications module included in the communications unit 1010 may be connected to an external communications network by various communications protocols to transmit and receive data.

The input unit 1020 may include a mechanical switch, a touchscreen, a voice recognition module, or the like, as a module allowing a user to control an operation of the electronic device 1000. In addition, the input unit 1020 may also include a mouse operated using a trackball scheme, a laser pointer scheme, or the like, or may include a finger mouse device. Further, the input unit 1020 may further include various sensor modules through which data is input by a user.

The output unit 1030 may output information processed by the electronic device 1000, in audio or visual form, and the memory 1040 may store a program for processing and control of the processor 1050, data, or the like. The processor 1050 may transfer a command to the memory 1040 according to a required operation to thus store data or retrieve the data therefrom. The memory 1040 may include at least one semiconductor device according to example embodiments of the present disclosure.

The memory 1040 may communicate with the processor 1050 through an interface embedded in the electronic device 1000 or through a separate interface. For example, when the memory 1040 communicates with the processor 1050 through a separate interface, the processor 1050 may store data in or retrieve data from the memory 1040 through various interface standards such as SD, SDHC, SDXC, MICRO SD, USB, or the like.

The processor 1050 may control operations of respective parts included in the electronic device 1000. The processor 1050 may perform controlling and processing of data relevant to voice communications, videotelephony, data communications, or the like, or operations relevant to multimedia reproduction and management. In addition, the processor 1050 may process an input by a user through the input unit 1020 and may output the processed results through the output unit 1030. Further, the processor 1050 may store data necessary for controlling operations of the electronic device 1000 in the memory 1040 or may retrieve data from the memory 1040.

As set forth above, according to example embodiments of the present disclosure, a leakage current of a semiconductor device may be reduced and the reliability thereof may be improved by forming an embedded gate electrode having a triple-layered structure.

While example embodiments have been shown and described above, it will be apparent to those skilled in the art that modifications and variations could be made without departing from the scope of the present disclosure, as defined by the appended claims.

What is claimed is:

1. A semiconductor device, comprising:
    a substrate including an active region and an element isolation region defining the active region;
    a gate trench extending into the element isolation region and penetrating the active region; and
    a gate structure filling the gate trench and including a first conductivity-type semiconductor layer, a conductive layer, and a second conductivity-type semiconductor layer, sequentially stacked from a lower portion of the gate trench.

2. The semiconductor device of claim 1, wherein the first conductivity-type semiconductor layer includes polycrystalline silicon doped with a p-type impurity, and the second conductivity-type semiconductor layer includes polycrystalline silicon doped with an n-type impurity.

3. The semiconductor device of claim 1, wherein the conductive layer includes a metal having a work function value higher than that of the first conductivity-type semiconductor layer and lower than that of the second conductivity-type semiconductor layer.

4. The semiconductor device of claim 1, further comprising source/drain regions disposed at an upper portion of the active region on opposite sides of the gate trench,
    wherein the second conductivity-type semiconductor layer has a region overlapping the source/drain regions, and
    wherein the conductive layer does not overlap the source/drain regions.

5. The semiconductor device of claim 4, wherein the gate trench includes a first portion located in the active region and a second portion located in the element isolation region, a depth of the second portion is deeper than a depth of the first portion, and
    the gate structure includes a main gate embedded in the first portion and a field pass gate embedded in the second portion.

6. The semiconductor device of claim 5, wherein the first conductivity-type semiconductor layer of the main gate has a first thickness in a direction parallel to an upper surface of the substrate fully depleted by a gate voltage in a standby mode, and
    the first conductivity-type semiconductor layer of the field pass gate has a second thickness in the direction parallel to an upper surface of the substrate greater than the first thickness.

7. The semiconductor device of claim 5, wherein an upper surface of the field pass gate is disposed to be lower than an upper surface of the main gate, and
    the field pass gate does not overlap the source/drain regions.

8. The semiconductor device of claim 5, wherein the main gate includes the first conductivity-type semiconductor layer, the conductive layer, and the second conductivity-type semiconductor layer, and
    the field pass gate does not include the second conductivity-type semiconductor layer.

9. The semiconductor device of claim 5, wherein a width of the field pass gate is narrower than a width of the main gate.

10. The semiconductor device of claim 4, further comprising a data storage element electrically connected to one of the source/drain regions.

11. A semiconductor device, comprising:
a substrate including an active region and an element isolation region defining the active region;
a main gate embedded in the active region; and
a field pass gate embedded in the element isolation region,
wherein each of the main gate and the field pass gate includes a first conductivity-type semiconductor layer, a metal layer, and a second conductivity-type semiconductor layer, sequentially stacked from corresponding lower portions of the main gate and the field pass gate.

12. The semiconductor device of claim 11, wherein the first conductivity-type semiconductor layer includes polycrystalline silicon doped with a p-type impurity, and
the second conductivity-type semiconductor layer includes polycrystalline silicon doped with an n-type impurity.

13. The semiconductor device of claim 11, wherein the metal layer includes a metal having a work function value higher than that of the first conductivity-type semiconductor layer and lower than that of the second conductivity-type semiconductor layer.

14. The semiconductor device of claim 11, further comprising source/drain regions disposed at an upper portion of the active region on opposite sides of the main gate,
wherein the second conductivity-type semiconductor layer has a region overlapping the source/drain regions, and
wherein the metal layer does not overlap the source/drain regions.

15. The semiconductor device of claim 11, wherein the first conductivity-type semiconductor layer of the main gate has a first thickness in a direction parallel to an upper surface of the substrate fully depleted by a gate voltage in a standby mode, and
the first conductivity-type semiconductor layer of the field pass gate has a second thickness in the direction parallel to the upper surface of the substrate greater than the first thickness.

16. A semiconductor device, comprising:
a substrate including an active region and an element isolation region adjacent to the active region;
a first gate trench embedded in the active region;
a second gate trench embedded in the element isolation region,
wherein each of the first gate trench and the second gate trench includes a gate structure having a multilayer structure in which conductive materials having different work functions are sequentially stacked from corresponding lower portions of the first gate trench and the second gate trench, and
wherein each of the first gate trench and the second gate trench includes a lowermost first conductivity-type semiconductor layer having a first work function value, an uppermost second conductivity-type semiconductor layer having a second work function value, and a conductive layer between the first conductivity-type semiconductor layer and the second conductivity-type semiconductor layer having a third work function value lower than the first work function value and higher than the second work function value.

17. The semiconductor device of claim 16, wherein the first conductivity-type semiconductor layer includes polycrystalline silicon doped with a p-type impurity, and the second conductivity-type semiconductor layer includes polycrystalline silicon doped with an n-type impurity.

18. The semiconductor device of claim 16, wherein the conductive layer includes a first portion having a first width which gradually decreases towards the lower portion of each of the first gate trench and the second gate trench and a second portion disposed on the first portion and having a second substantially uniform width wider than the first width in a direction parallel to an upper surface of the substrate.

19. The semiconductor device of claim 16, wherein a thickness of the conductive layer of the gate structure of the second gate trench in a first direction perpendicular to an upper surface of the substrate is greater than a thickness of the conductive layer of the gate structure of the first gate trench in the first direction perpendicular to the upper surface of the substrate.

* * * * *